(12) United States Patent
Tang et al.

(10) Patent No.: US 9,857,421 B2
(45) Date of Patent: Jan. 2, 2018

(54) DYNAMIC DESIGN PARTITIONING FOR DIAGNOSIS

(71) Applicant: Mentor Graphics Corporation, Wilsonville, OR (US)

(72) Inventors: Huaxing Tang, Wilsonville, OR (US); Yu Huang, Sudbury, MA (US); Wu-Tung Cheng, Lake Oswego, OR (US); Robert B. Benware, Clackamas, OR (US); Xiaoxin Fan, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/146,761

(22) Filed: May 4, 2016

(65) Prior Publication Data

US 2016/0245866 A1    Aug. 25, 2016

Related U.S. Application Data

(63) Continuation of application No. 13/680,447, filed on Nov. 19, 2012, now Pat. No. 9,336,107.

(Continued)

(51) Int. Cl.
| | |
|---|---|
| *G06F 11/22* | (2006.01) |
| *G06F 17/50* | (2006.01) |
| *G01R 31/317* | (2006.01) |
| *G06F 11/26* | (2006.01) |
| *G01R 31/3177* | (2006.01) |

(52) U.S. Cl.
CPC ... *G01R 31/31703* (2013.01); *G01R 31/3177* (2013.01); *G06F 11/26* (2013.01)

(58) Field of Classification Search
USPC .......................................... 716/104, 106, 136
See application file for complete search history.

(56) References Cited

U.S. PATENT DOCUMENTS

| | | |
|---|---|---|
| 6,421,818 B1 | 7/2002 | Dupenloup et al. |
| 6,975,976 B1 | 12/2005 | Casavant et al. |

(Continued)

OTHER PUBLICATIONS

Fan et al., "On Using Design Partitioning to Reduce Diagnosis Memory Footprint," in Proceedings of IEEE Asian Test Symposium (2011).

(Continued)

*Primary Examiner* — Brian Ngo
(74) *Attorney, Agent, or Firm* — Klarquist Sparkman, LLP

(57) ABSTRACT

Aspects of the invention relate to techniques for fault diagnosis based on dynamic circuit design partitioning. According to various implementations of the invention, a sub-circuit is extracted from a circuit design based on failure information of one or more integrated circuit devices. The extraction process may comprise combining fan-in cones of failing observation points included in the failure information. The extraction process may further comprise adding fan-in cones of one or more passing observation points to the combined fan-in cones of the failing observation points. Clock information of test patterns and/or layout information of the circuit design may be extracted and used in the sub-circuit extraction process. The extracted sub-circuit may then be used for diagnosing the one or more integrated circuit devices.

14 Claims, 12 Drawing Sheets

Flow chart 500

Related U.S. Application Data

(60) Provisional application No. 61/561,768, filed on Nov. 18, 2011.

(56) References Cited

U.S. PATENT DOCUMENTS

| | | |
|---|---|---|
| 7,249,332 B1 | 7/2007 | Agmon |
| 7,454,324 B1 | 11/2008 | Seawright et al. |
| 2003/0110474 A1 | 6/2003 | Ur et al. |
| 2003/0115564 A1 | 6/2003 | Chang et al. |
| 2004/0098683 A1 | 5/2004 | Maruyama et al. |
| 2006/0010428 A1 | 1/2006 | Rushby et al. |
| 2006/0190848 A1 | 8/2006 | Oosuka et al. |
| 2007/0022394 A1* | 1/2007 | Ghosh ............... G06F 17/504 716/102 |
| 2007/0180414 A1* | 8/2007 | Harer ................. G06F 17/504 716/103 |
| 2008/0066032 A1 | 3/2008 | Levitt et al. |
| 2008/0276144 A1 | 11/2008 | Huben et al. |
| 2012/0079439 A1 | 3/2012 | Akar et al. |
| 2013/0019216 A1* | 1/2013 | Vasudevan ........... G06F 17/504 716/106 |

OTHER PUBLICATIONS

Pomeranz et al., "Location of Stuck-at Faults and Bridging Faults Based on Circuit Partitioning," In Proceedings of IEEE Transcations on Computers, vol. 47, No. 10, pp. 1124 (1998).

\* cited by examiner

Initial Partition Based on Failing Bits

0: Let $P$ be the initial partition and initially $P = \Phi$.
1: For each failing pattern $T_i$
2:    Let $FB_i$ be the set of failing bits for failing pattern $T_i$
3:    Let $CLK_i$ be the saved clock information of $T_i$
3:    For each failing bit $fb_{ij}$ in $FB_i$
4:      Let $G_{ij}$ be the set of gates obtained by back tracing from $fb_{ij}$ using clock information $CLK_i$
      $P = P \cup G_{ij}$
5:    End For
6: End For

FIG. 10

Final Partition Based on Passing Bits

0:   Let $P$ be the initial partition.

1:   For each failing pattern $T_i$

2:      Let $FB_i$ be the set of failing bits for $T_i$

3:      Let $O_i$ be the set of observation points with active clocks at the last frame of $T_i$ 4:      Let $PB_i = O_i - FB_i$ be the set of passing bits with active clocks for $T_i$ 5:      Let $CLK_i$ be the saved clock information of $T_i$ 6:      For each passing bit $pb_{ij}$ in $PB_i$ 7:          Let $G_{ij}$ be the set of gates obtained by back tracing from $pb_{ij}$ using clock information $CLK_i$ 8:          Compute $SGR(pb_{ij})$ 9:      End For

10:  End For

11:  Sort all the passing bits $pb_{ij}$ by SGR

12:  While $|P|$ < partition size limit

13:     Pick an unselected passing bit $pb_{ij}$ with highest SGR

14:     $P = P \cup G_{ij}$

15:     Mark $pb_{ij}$ selected

16:  End While

FIG. 11

DYNAMIC DESIGN PARTITIONING FOR DIAGNOSIS

RELATED APPLICATIONS

This application is a continuation of U.S. patent application Ser. No. 13/680,447, filed Nov. 19, 2012, which claims the benefit of U.S. Provisional Patent Application No. 61/561,768, entitled "Dynamic Design Partitioning For Diagnosis," filed on Nov. 18, 2011, and naming Huaxing Tang et al. as inventors. Application Ser. No. 13/680,447 and Application No. 61/561,768 are hereby incorporated herein by reference in their entireties.

FIELD OF THE INVENTION

The present invention relates to the field of integrated circuit (IC) testing technology. Various implementations of the invention may be particularly useful for fault diagnosis.

BACKGROUND OF THE INVENTION

Quick yield ramp-up is critical for IC manufacturing. During a yield ramp-up process, yield learning methods may be employed to identify systematic yield limiters. As the circuit feature size continuously shrinks and the design complexity continuously increases, traditional yield learning methods such as inline inspection, memory bitmapping and test chips are becoming less effective. Recently, statistical yield learning methods based on volume diagnosis have been developed. These methods statistically analyze diagnosis results for a large number of failing devices to extract systematic issues and/or dominant defect mechanisms.

For practical applications of these statistical yield learning methods, high quality volume diagnosis needs to be accomplished with a reasonable amount of computational resources and within a reasonable amount of time. With the size of modern circuit designs increasing continuously, however, the time for diagnosing a single failing device keeps increasing. Moreover, the larger the circuit design for a failing device, the greater amount of physical memory required. For a circuit design with hundreds of millions of gates, for example, a diagnosis tool may require up to hundreds of giga-bytes of memory.

The volume diagnosis speed may be increased by equipping workstations with more processors and by improving the performance of diagnosis algorithms with various techniques such as pattern sampling, fault dictionary, and machine learning. On the other hand, the total amount of physical memory in a workstation cannot be increased as fast as the number processors. As a result, even for current workstations with the largest memory and tens of processors, a few diagnosis programs will use up all the memory and most of the processors will have to stay idle, limiting the number of concurrently running diagnosis programs. The low efficiency of resource utilization, in addition to the increasing processor time for each failing integrated circuit device (or failing die), presents a serious challenge to diagnosis throughput and thus to practical applications of the yield learning methods based on volume diagnosis.

BRIEF SUMMARY OF THE INVENTION

Aspects of the invention relate to techniques for fault diagnosis based on dynamic circuit design partitioning. According to various implementations of the invention, a sub-circuit is extracted from a circuit design based on failure information of one or more integrated circuit devices. The failure information is generated by applying test patterns to testing the one or more integrated circuit devices. The extraction process may comprise combining fan-in cones of failing observation points included in the failure information. The extraction process may further comprise adding fan-in cones of one or more passing observation points to the combined fan-in cones of the failing observation points. The one or more passing observation points are selected based on relationship with the failing observation points. The relationship may be represented by shared gate ratios.

Clock information of the test patterns may be extracted and used in the sub-circuit extraction process. The application of the clock information may help reduce the size of the sub-circuit.

Layout information of the circuit design may also be extracted and used in the sub-circuit extraction process. The application of the layout information may help to include relevant circuit parts in the sub-circuit in some circumstances.

Conventional diagnosis methods may then be performed on the extracted sub-circuits for the one or more integrated circuit devices. The sub-circuit extraction process and the sub-circuit diagnosis process may be performed by different computers. As such, a plurality of failing integrated circuit devices can be diagnosis in parallel.

BRIEF DESCRIPTION OF THE DRAWINGS

FIG. 10 illustrates an example of a pseudo code for generating an initial partition according to various embodiments of the invention.

FIG. 11 illustrates an example of a pseudo code for generating a final partition based on passing bits according to various embodiments of the invention

DETAILED DESCRIPTION OF THE INVENTION

General Considerations

Figure 1:
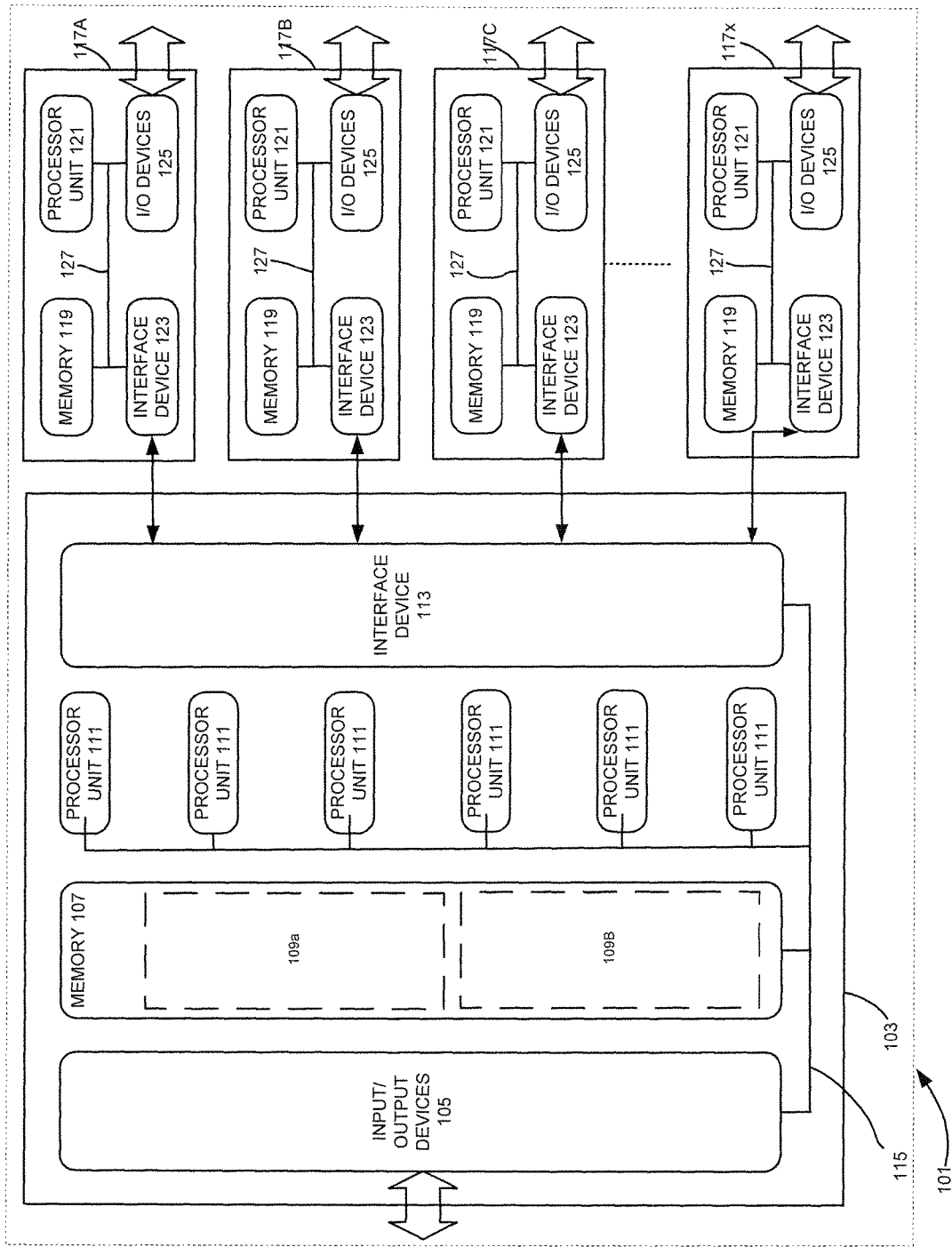
FIG. 1 illustrates an example of a computing system that may be used to implement various embodiments of the invention.

Various aspects of the present invention relate to using dynamic design partitioning for fault diagnosis. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "extract," "perform," and "combine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
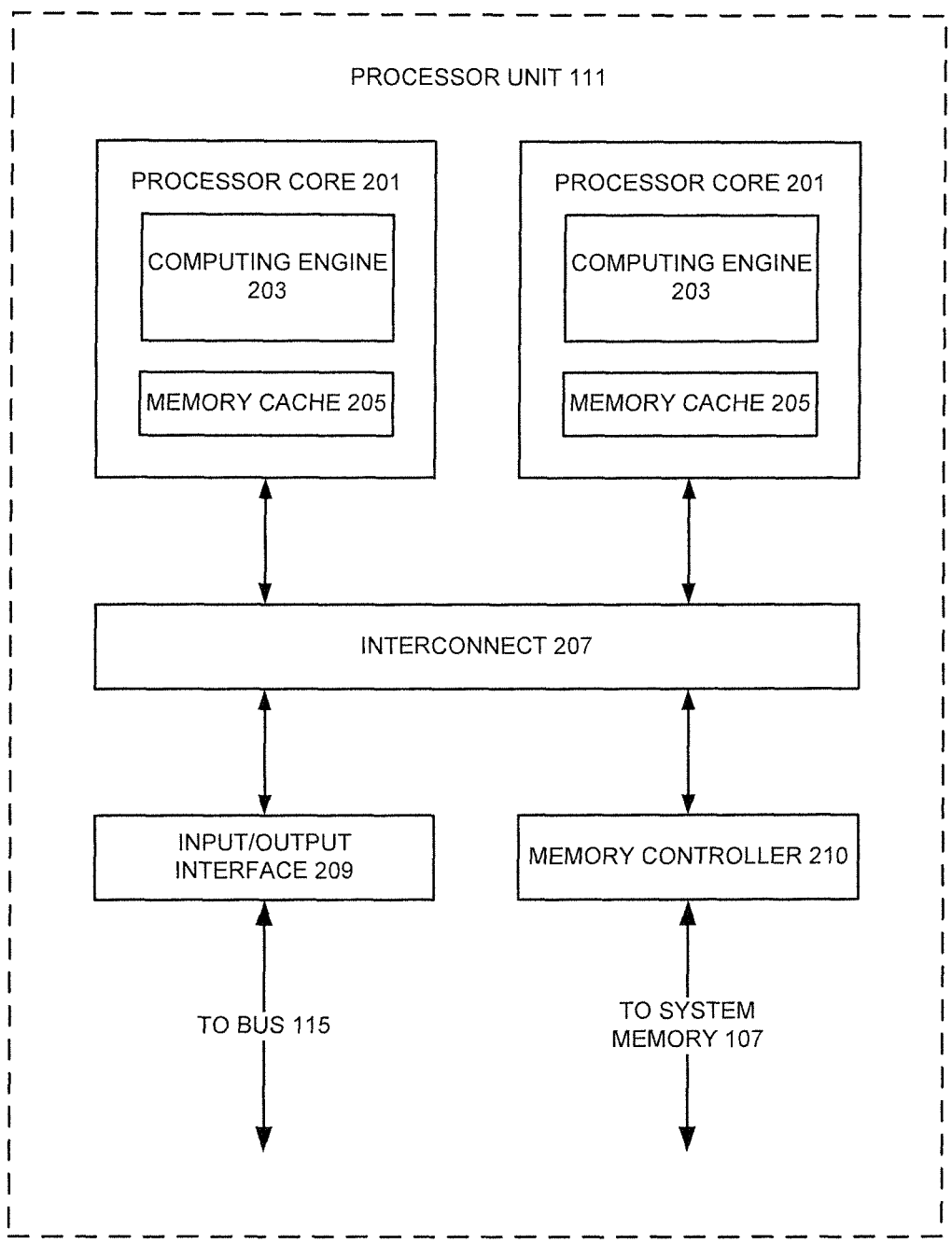
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 210. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Fault Diagnosis

Diagnosis methods generally fall into two categories: cause-effect analysis and effect-cause analysis. The cause-effect analysis usually builds a fault dictionary through fault simulation. Upon collecting test results with a tester, the fault dictionary is looked up to find a set of suspects that best match the test results. The size of a complete fault dictionary is proportional to $O(F \cdot T \cdot O)$ where F is the number of faults, T is the number of test patterns and O is the number of outputs. For circuit design with millions of gates, a large amount of storage space is needed for the fault dictionary.

Figure 3:
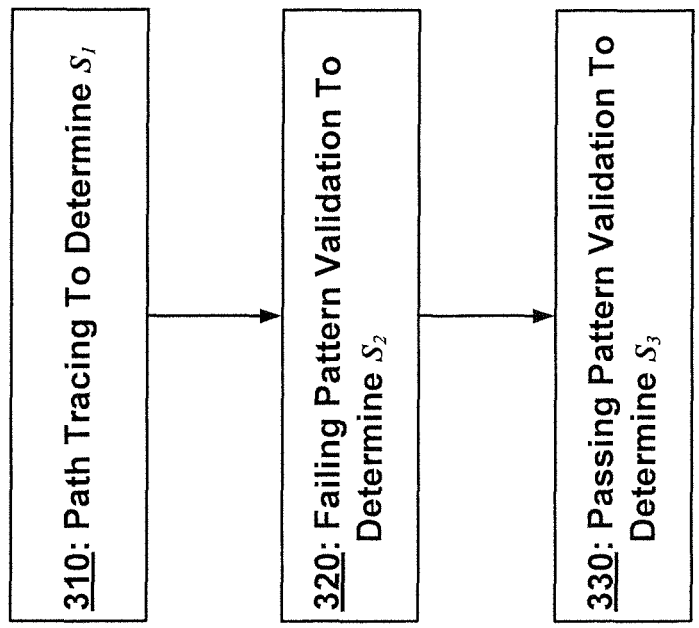
FIG. 3 illustrates an example of an effect-cause diagnosis process.

By contrast, the effect-cause analysis directly examines the test results and identifies suspects through fault simulation. An example of an effect-cause diagnosis process is illustrated in FIG. 3. It starts with path-tracing operation 310 that identifies an initial set of fault candidates $S_1$ based on failing bits included in the test results. This operation may comprise simulating the fault-free circuit (or good circuit) and using the computed signal values for tracing paths from a failing point. Here, a failing (passing) bit for a test pattern or a test set corresponds to a failing (passing) observation point and they are used interchangeably in this disclosure. A failing (passing) observation point is an observation point that captures a failing (passing) value. An observation point can be a scan cell or a primary output. A fault suspect may be included in the initial set of fault candidates $S_1$ if a parity-consistent path exists from the fault suspect to a failing observation point.

Next, in failing pattern validation operation 320, the initial set of fault candidates $S_1$ can be pruned by validation with failing test patterns. A failing test pattern is a test pattern that generates at least one failing bit. The failing pattern validation operation 320 injects an initial fault candidate and performs simulation to determine whether it is a valid fault suspect. A fault candidate may be added to a set of fault suspects $S_2$ if the simulated result matches the observed failing/passing bits. The size of the set of fault suspects $S_2$ is usually much smaller than that of the initial set of fault candidates $S_1$.

Finally, in passing pattern validation operation 330, the size of the set of fault suspects $S_2$ may be reduced by determining whether the simulated results conflict with the observed passing bits for one or more passing test patterns of the failing die. If a fault suspect in $S_2$ fails during the passing pattern validation operation 230, it is less likely to be the real defect and thus may be assigned a low score or completely discarded. The final diagnosis report may comprise a set of final fault suspects $S_3$, ranked based on their scores.

In the above process, the majority of the processor time and the memory usage are spent on the circuit simulation including good-circuit simulation for path-tracing and faulty-circuit simulation for failing and passing pattern validation. With the growing size of the design, both the processor time and the memory usage for circuit simulation grow proportionally. To increase the diagnosis throughput and reduce the requirement of computing resources, it is thus desirable to perform simulation on not the whole but a portion of a large circuit design at a time.

Dynamic Design Partitioning

A sub-circuit for diagnosis may be extracted from the circuit design of the circuit based on failure information generated by applying test patterns to a circuit under test. The sub-circuit extraction can be viewed as a circuit partitioning process: dividing the circuit design into two portions, one of them as the sub-circuit for diagnosis. This partitioning is dynamic because different sub-circuits may be extracted for failing integrated circuit devices that are built with the same circuit design but have different failure information.

Gates outside of the fan-in cones of failing observation points usually cannot explain observed fault responses. The fan-in cone of a failing (passing) observation point refers to the set of gates that can structurally reach the failing (passing) observation point. Sometimes the effect of a fault may be masked by another fault with respect to a test pattern, but the fault often can be detected with other test patterns. Therefore, defects usually can be located in the union of fan-in cones of failing observation points (or failing bits) for all failing test patterns and some embodiments of the invention derive the sub-circuit for diagnosis based on the union.

Figure 4B:
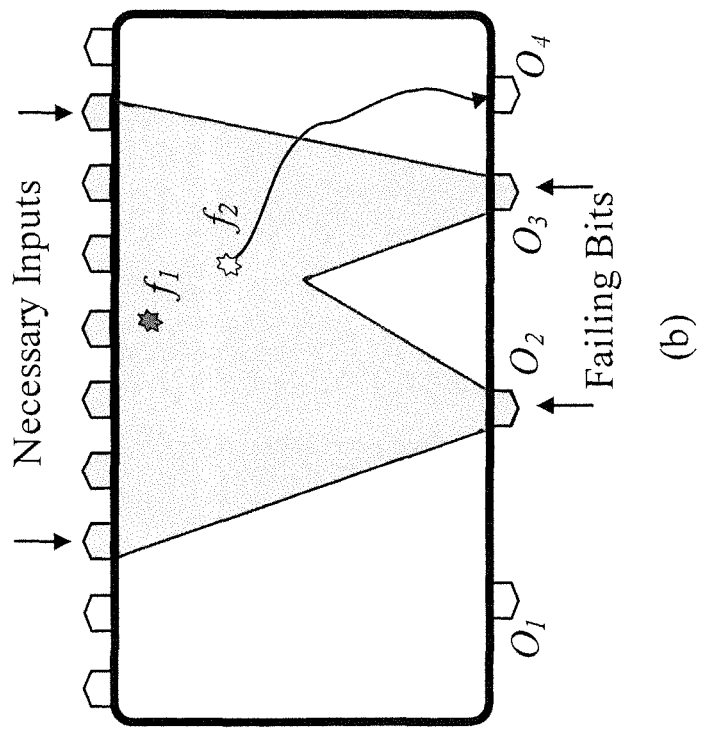
FIG. 4b illustrates an example for improving diagnosis resolution by adding passing observation points to the combined fan-in cones of failing bits.
Figure 4A:
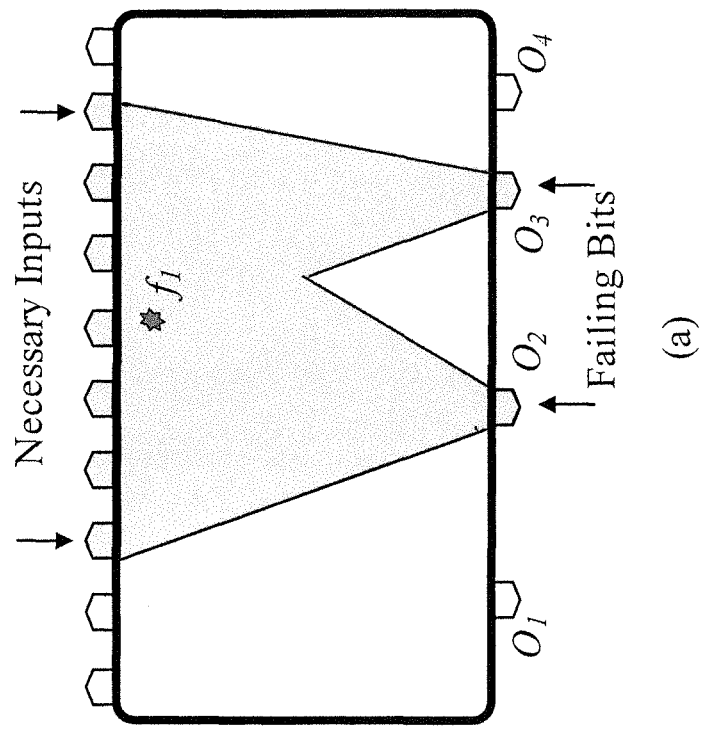
FIG. 4a illustrates an example of dynamic partitioning partition through combining fan-in cones of failing bits according to various embodiments of the invention.

FIG. 4a illustrates an example of dynamic partitioning partition through combining fan-in cones of failing bits according to various embodiments of the invention. In this simple example, there is one defect $f_1$ in the circuit and the fault effects are captured at two observation points $O_2$ and $O_3$ by applying one or two test patterns. Starting from these two failing bits, structurally tracing backward will obtain a sub-circuit (in the shadowed region) that can be used for diagnosis to speed up the process.

Simulating only a portion of a circuit may affect diagnosis accuracy and resolution. The diagnosis accuracy may be measured by a ratio of the number of reported fault/defect candidates (suspects) that are real faults/defects to the number of real faults/defects, while the resolution may be represented by the average number of reported fault/defect candidates per real defect. If a single defect exists, diagnosis using the sub-circuit extracted above cannot impact the diagnosis accuracy compared to using the full circuit as the defect $f_1$ is located in the sub-circuit. This can be explained using the diagnosis process illustrated in FIG. 3. The path-tracing operation 310 starts critical path tracing from failing bits and thus will include the defect in the initial set of fault candidates $S_1$.

Unlike the diagnosis accuracy, the diagnosis resolution may become worse. This is because some fake suspects cannot be identified by the failing pattern validation operation 320 or the passing pattern validation operation 330 due to the lack of observation points in the sub-circuit. The diagnosis resolution problem can be alleviated by methods discussed later.

Fault Diagnosis Tools and Methods

Figure 5:
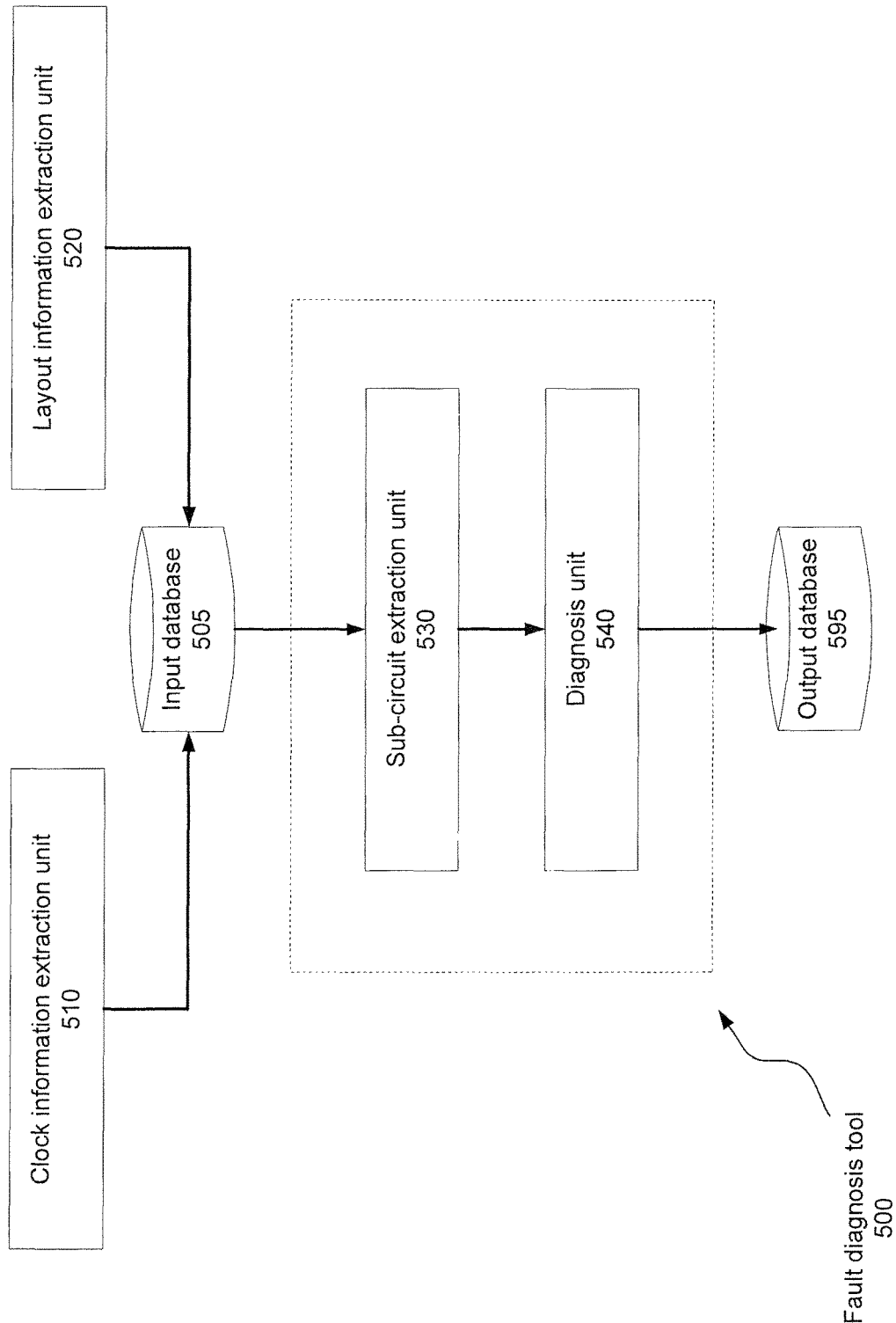
FIG. 5 illustrates an example of a fault diagnosis tool according to various embodiments of the invention.

FIG. 5 illustrates an example of a fault diagnosis tool according to various embodiments of the invention. As seen in the figure, the fault diagnosis tool 500 includes two units: a sub-circuit extraction unit 530 and a diagnosis unit 540. As will be discussed in more detail below, some implementations of the fault diagnosis tool 500 may cooperate with (or incorporate) one or more of a clock information extraction unit 510, a layout information extraction unit 520, an input database 405 and an output database 495. While the input database 505 and the output database 595 are shown as separate units in FIG. 5, a single data storage medium may be used to implement some or all of these databases.

According to some embodiments of the invention, one or more of the sub-circuit extraction unit 530, the diagnosis unit 540, the clock information extraction unit 510, and the layout information extraction unit 520 may be implemented by executing programming instructions on one or more programmable computers/computer systems, such as the computing system illustrated in FIGS. 1 and 2. With some implementations of the invention, the sub-circuit extraction unit 530 is implemented by executing programming instructions on a master computer such as the master computer 103 in FIG. 1 while the diagnosis unit 540 is implemented by executing programming instructions on a plurality of servant computers such as the servant computers 117A, 117B . . . and 117X in FIG. 1. As such, only the master computer needs a large size of memory for full circuit analysis and the servant computers may run sub-circuit diagnosis concurrently for a large number of failing dies.

Correspondingly, some other embodiments of the invention may be implemented by software instructions, stored on a non-transitory computer-readable medium, for instructing one or more programmable computers/computer systems to perform the functions of one or more of the sub-circuit extraction unit 530, the diagnosis unit 540, the clock information extraction unit 510, and the layout information extraction unit 520. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 6:
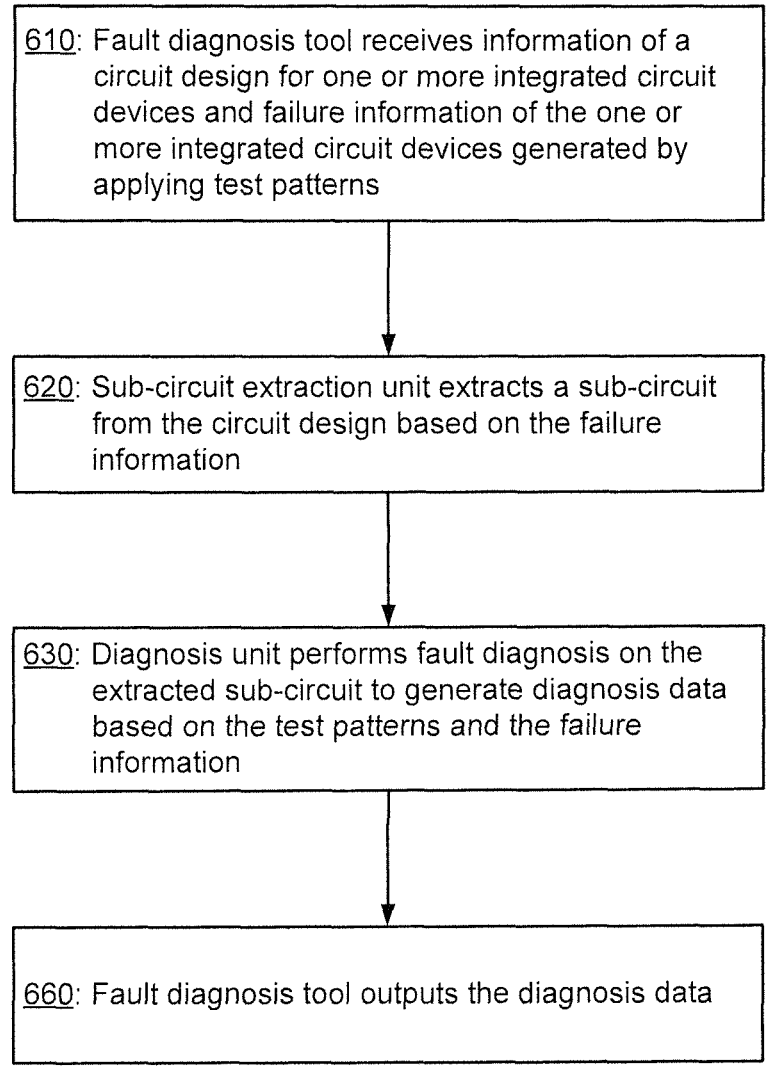
FIG. 6 illustrates a flowchart describing fault diagnosis methods that may be employed by various embodiments of the invention.

For ease of understanding, fault diagnosis methods that may be employed according to various embodiments of the invention will be described with reference to the fault diagnosis tool 500 illustrated in FIG. 5 and the flow chart 600 in FIG. 6. It should be appreciated, however, that alternate implementations of a fault diagnosis tool may be used to perform the fault diagnosis method shown in the flow chart 600 according to various embodiments of the invention. In addition, it should be appreciated that implementations of the fault diagnosis tool 500 may be employed with other fault diagnosis methods according to different embodiments of the invention.

Initially, in operation 610, the fault diagnosis tool 500 receives information of a circuit design for one or more integrated circuit devices and failure information of the one or more integrated circuit devices generated by applying test patterns. The information of a circuit design may comprise a netlist for the circuit design. The failure information may be obtained using automatic test equipment (a conventional tester). Typically, the automatic test equipment loads the test patterns into the one or more integrated circuit devices and captures corresponding circuit responses (test responses). The test responses may be compared with good machine values to generate the failure information.

Next, in operation 620, the sub-circuit extraction unit 530 extracts a sub-circuit from the circuit design based on the failure information. The failure information includes failing observation points for a test pattern or a set of test patterns. With some implementations of the invention, the sub-circuit extraction unit 530 may combine fan-in cones of the failing observation points to derive the sub-circuit. As noted before, a fan-in cone of an observation point may be obtained by structurally tracing backward from the observation point. It should be appreciated that during volume diagnosis, one sub-circuit may be extracted on the failure information for a single defective die or for multiple defective dies.

The diagnosis resolution can be problematic if the sub-circuit formed based only on failing observation points is used for diagnosis. The problem may be alleviated by adding fan-in cones of one or more passing observation points to the combined fan-in cones of the failing observation points. The one or more passing observation points used for improving diagnosis resolution may be selected from those associated with the failing patterns. Additionally or alternatively, they may be selected from those associated with the passing patterns. FIG. 4b illustrates an example for improving the diagnosis resolution by adding passing observation points. If the fan-in cone of passing bit $O_4$ is added to the sub-circuit formed based on the failing bits $O_2$ and $O_3$, the fake suspect $f_2$ will be identified and disqualified as a fault candidate.

While including more fan-in cones of passing bits may further reduce the resolution loss, the increased sub-circuit size would increase the run time and memory footprint for diagnosis, and thus reduces the overall throughput improvement. Moreover, some passing observation points may have no contribution in filtering the fake suspects if they cannot observe any initial suspects, such as $O_1$ in FIG. 4b. Therefore passing bits for minimizing the diagnosis resolution need to be carefully selected. The selection methods may be based on analyzing relationship between passing bits and failing bits. One of such selection methods employs a parameter called shared gate ratio (SGR). The SGR for a passing bit $pb_i$ with the initial partition P is defined as:

$$SGR(pb_i) = \frac{|C_i \cap P|}{|C_i|}$$

where $C_i$ is the set of gates obtained by back tracing from $pb_i$, P is the set of gates in the combined fan-in cones of the failing bits. $|C_i \cap P|$ represents the number of common gates between $C_i$ and P. A passing bit with larger $|C_i \cap P|$ implies it has a higher chance of observing the faults effects prorogating from the combined fan-in cones of the failing bits. Using SGR may prevent the selected passing bit from including too many unnecessary gates. In some embodiments of the invention, passing bits may be sorted based on their SGRs and added into the sub-circuit accordingly.

Figure 7A:
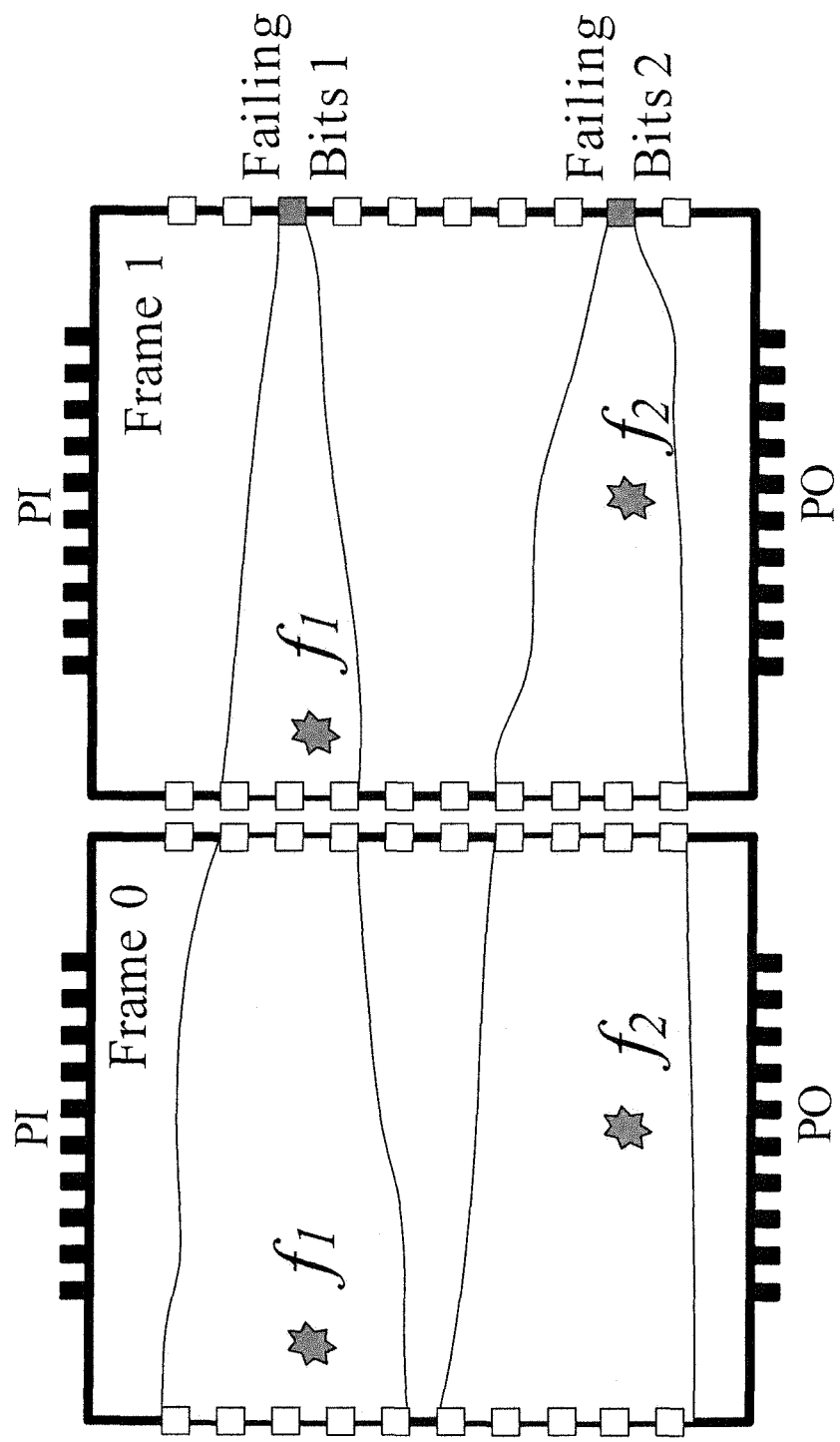
FIG. 7a illustrates a potential problem for tracing back based only on circuit structure information.

Simply utilizing the circuit structure information to trace back from the observation points to find all the gates necessary for simulation may lead to an unnecessarily large size of the sub-circuit, in particular for sequential test patterns. FIG. 7a illustrates an example explaining the problem. With the increasing number of frames in sequential test patterns, more gates will be included as one failing bit may lead to several observation points in the previous clock frame. In a typical modern design, there are many clock domains but only one, or a few clocks may be activated during any given clock frame. In addition, clock gaters are extensively used to reduce the power consumption, and thus many scan cells may be idle for one particular test pattern. Simulating scan cells when they are not activated may be unnecessary. Therefore, the sub-circuit extraction unit 530 may employ clock information for the test patterns in the sub-circuit extraction process to keep the sub-circuit size small.

Figure 7B:
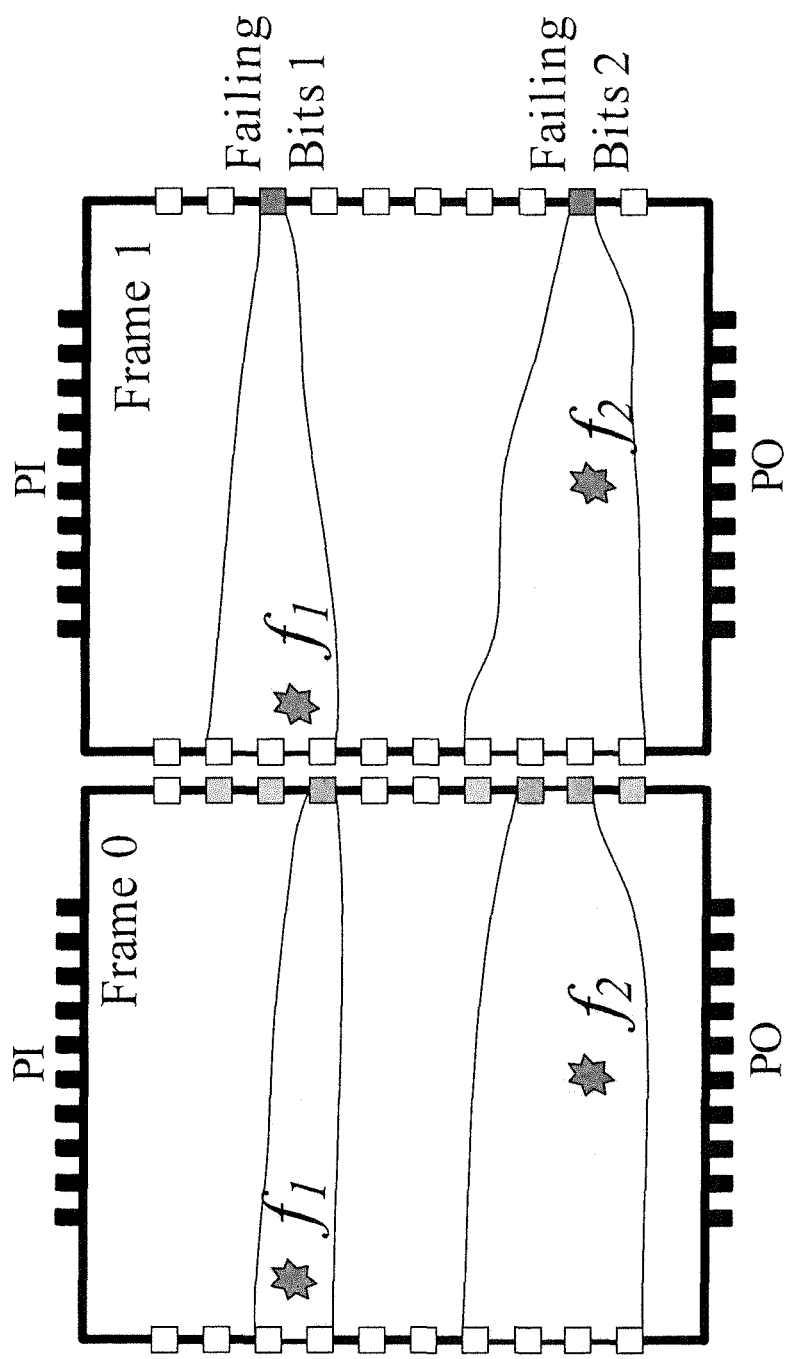
FIG. 7b illustrates an example of applying clock information for test patterns to a sub-circuit extraction process according to various embodiments of the invention.

FIG. 7b illustrates an example of applying the clock information for the test patterns to the sub-circuit extraction process according to various embodiments of the invention. In the figure, seven scan cells are connected to two failing bits through back tracing in Frame 1. Assuming the clock information of the failing pattern indicates that three out of the seven scan cells have active clocks in Frame 0. So when conducting back tracing in Frame 0, only these three scan cells with active clocks will be used. The obtained sub-circuit will be smaller than the one shown in FIG. 7a.

Figure 8:
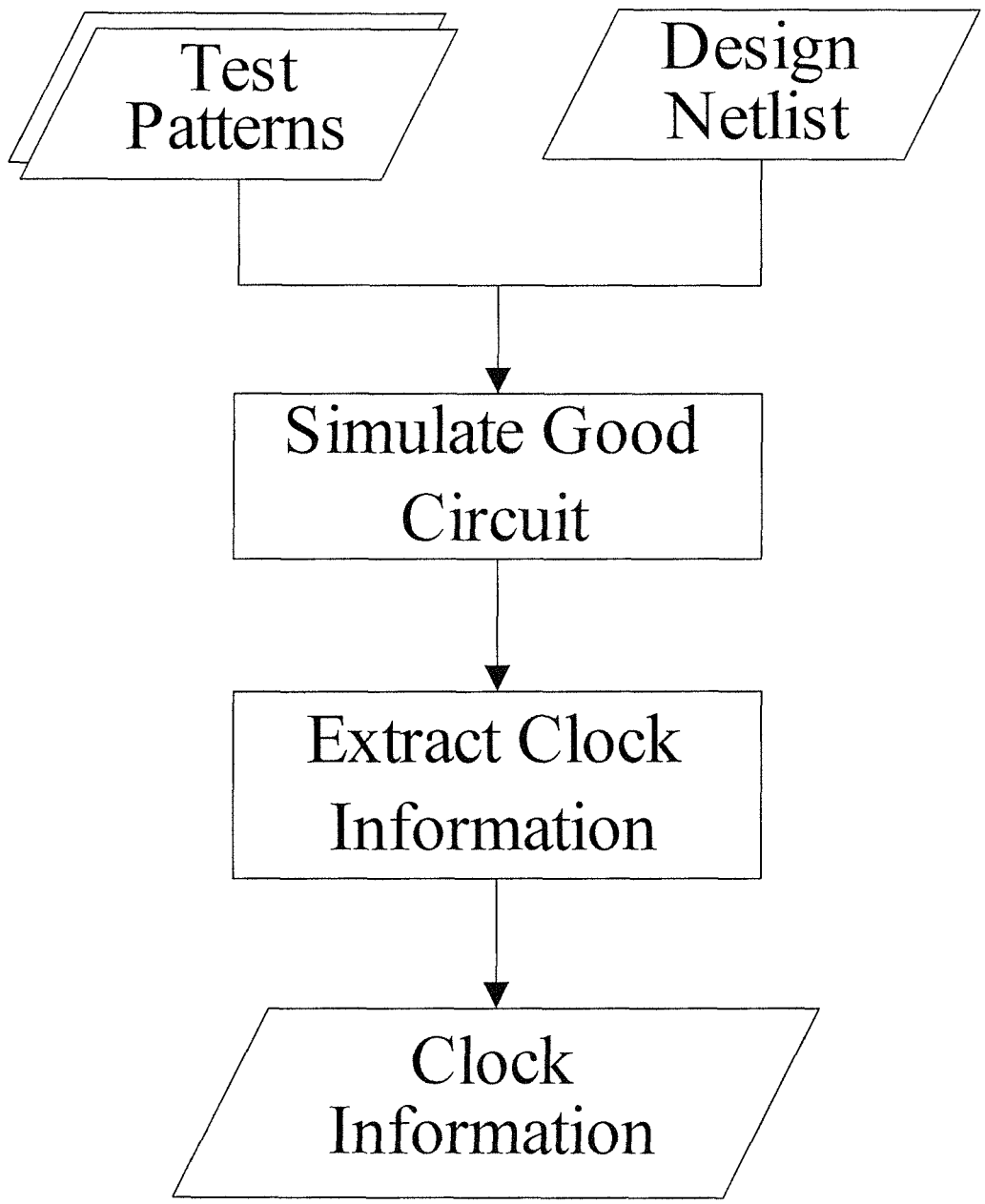
FIG. 8 illustrates a flow chart describing methods for extracting clock information for test patterns according to various embodiments of the invention.

The clock information extraction unit 510 can be used to extract the clock information for reducing the sub-circuit size. FIG. 8 presents a flow chart describing methods for extracting the clock information that may be employed by the clock information extraction unit 510. Test patterns are simulated on the good circuit to extract the clock information. While the full circuit is simulated, the extraction is a one-time cost and may be done before diagnosing the failing dies which takes a much longer time.

Figure 9:
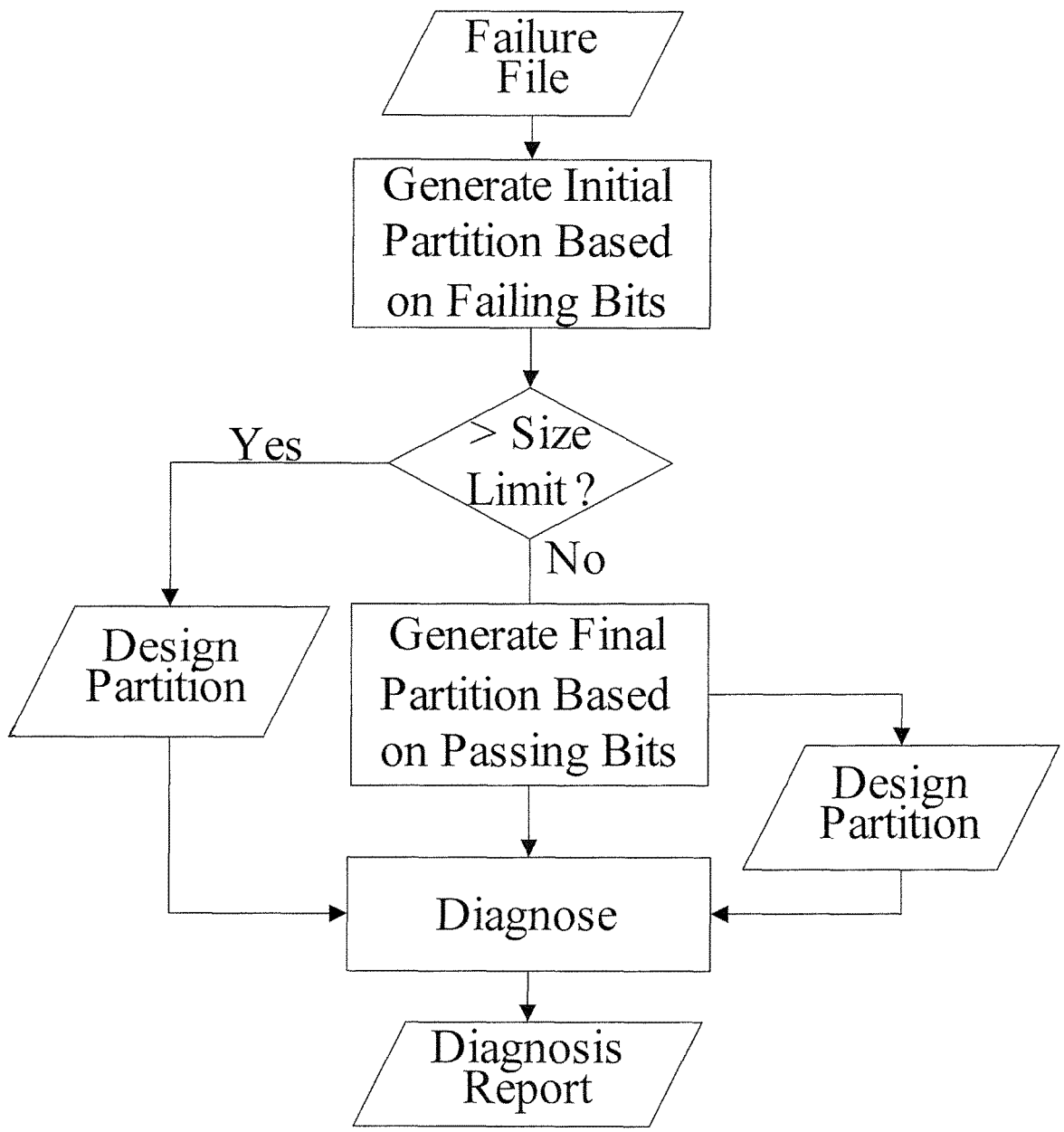
FIG. 9 illustrates a flow chart describing methods for extracting the sub-circuit according to various embodiments of the invention.

FIG. 9 presents a flow chart describing methods for extracting the sub-circuit that may be employed by the sub-circuit extraction unit 530. For a given failure file, an initial partition is generated by including all the gates in the fan-in cones of all the failing bits. The pre-extracted clock information may be used to skip the unneeded gates and thus reduce the final partition size during back tracing. In order to keep the partition to a reasonable size, an upper bound of the partition size in terms of number of gates may be pre-defined, such as 10% of the total number of gates of the original design. If the size of the initial partition obtained is larger than the partition size limit, the initial partition is treated as the final partition. If the size of the initial partition is smaller than the size limit, more gates in fan-in cones of selected passing bits will be incrementally added into the partition until the desired partition size limit is reached. The final partition will be used as the sub-circuit for diagnosis.

FIG. 10 presents an example of the pseudo code for generating the initial partition. During back tracing from a failing bit, its corresponding clock information is applied to prune the size of the set of traced gates. Whenever the back tracing reaches a scan cell at a time frame boundary, it will check the corresponding extracted clock information to see if the cell is active or not. If the scan cell is not active, the back tracing will stop, otherwise it will continue to trace back from that scan cell in the previous frame if it exists.

FIG. 11 presents an example of the pseudo code for generating the final partition based on passing bits. Similarly to the failing bit back tracing, the passing bit back tracing is done per failing test pattern. For each test pattern, the observation points with active clocks are determined on line 3 since the observation points without active clocks do not capture the fault effects. The active passing bits are then derived on line 4. Usually the number of active observation points in the last frame of a test pattern is much smaller compared to the total number of observation points. The clock information is used to guide the passing bit back tracing so that the set of gates obtained is minimal. After back tracing, the SGR can be computed. Note that for a passing bit under two different patterns, we may consider it as two different passing bits with different SGRs. The passing bits can be sorted in descending order of SGR, thus the top passing bit is the one that can capture the most fault effects from the initial suspects. The final partition is then obtained by incrementally adding the gates traced from the top ranked passing bits until the user defined limit is reached.

It should be appreciated that the illustration of the methods/algorithms in FIGS. 8-11 is representative only, and is not intended to be limiting.

In addition to the failure information and the clock information, the sub-circuit extraction unit 530 may also use layout information for the sub-circuit extraction in some situations. One of such situations is existence of a dominant bridge defect. For a dominant bridge defect, only one net (victim net) in a pair of nets (bridge suspect candidate) shows defective behavior while the other (aggressor net) does not. Back tracing from the failing bit may miss the aggressor net and thus the subsequent fault simulation may not include the defect as defect candidates. To solve the problem, the sub-circuit extraction unit 530 can identify, based on the layout information, aggressor net candidates that may affect the sub-circuit obtained above and add fan-in cones of these aggressor net candidates to the sub-circuit.

After the sub-circuit extraction is completed, in operation 630, the diagnosis unit 540 performs fault diagnosis on the extracted sub-circuit to generate diagnosis data based on the test patterns and the failure information. The test patterns may be mapped to the extracted sub-circuit to derive the sub-circuit test patterns. The size of the sub-circuit is usually much smaller than that of the whole circuit. Thus, the diagnosis unit 540 may use multiple servant computers to run diagnosis for a number of failing dies in parallel, as noted previously. The diagnosis process may follow the whole or a part of the process illustrated in FIG. 3. The passing pattern validation may also be performed before the validating failing patterns.

Finally, in operation 640, the fault diagnosis tool 500 outputs the diagnosis data. The outputting may comprise storing the diagnosis data in a computer medium.

It should be appreciated that the invention is applicable for circuit designs with on-chip test compression schemes. The observation point may be the output of the test compactor whose inputs are several internal observation points (scan cells). When back tracing a failing/passing observation point, all the internal observation points that feed into the observed compactor output may be traced. Clock information extracted in the preprocessing stage can be applied to reduce the number of internal observation points that need to be traced in a similar way.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more processor-readable storage device storing computer-executable instructions for causing one or more processors to perform a method, the method comprising:
   with the one or more processors,
      receiving failure information for one or more integrated circuit devices, the failure information resulting from test patterns being applied to the one or more integrated circuit devices;
      extracting a sub-circuit from a circuit design for the one or more integrated circuit devices based on the failure information, the sub-circuit comprising one or more portions of the circuit design that include one or more defects in the one or more integrated circuit devices, wherein the extracting comprises combining fan-in cones of failing observation points and adding fan-in cones of one or more passing observation points to the combined fan-in cones of the failing observation points, wherein the one or more passing observation points are selected based on one or more relationships with the failing observation points, wherein the one or more relationships are represented by shared gate ratios;

performing fault diagnosis on the sub-circuit to generate diagnosis data based on the test patterns and the failure information; and outputting the diagnosis data.

2. The one or more processor-readable storage device of claim 1, wherein the adding is performed if a size of the sub-circuit is smaller than a predetermined value.

3. The one or more processor-readable storage device of claim 1, wherein the extracting is further based on clock information of the test patterns.

4. The one or more processor-readable storage device of claim 1, wherein the extracting is further based on layout information of the circuit design.

5. The one or more processor-readable storage device of claim 1, wherein the extracting and the performing employ different processors for at least one of the one or more integrated circuit devices.

6. A method of fault diagnosis, comprising:
by one or more computers,
receiving information of a circuit design for one or more integrated circuit devices and failure information of the one or more integrated circuit devices generated by applying test patterns to the one or more integrated circuit devices;
extracting a sub-circuit from the circuit design based on the failure information, the sub-circuit comprising one or more portions of the circuit design that include one or more defects in the one or more integrated circuit devices, wherein the extracting comprises combining fan-in cones of failing observation points and adding fan-in cones of one or more passing observation points to the combined fan-in cones of the failing observation points, wherein the one or more passing observation points are selected based on one or more relationships with the failing observation points, wherein the at least one of the one or more relationships is represented by one or more shared gate ratios;
performing fault diagnosis on the sub-circuit to generate diagnosis data based on the test patterns and the failure information; and
outputting the diagnosis data.

7. The method of claim 6, wherein the adding is performed if a size of the sub-circuit is smaller than a predetermined value.

8. The method of claim 6, wherein the extracting is further based on clock information of the test patterns.

9. The method of claim 6, wherein the extracting is further based on layout information of the circuit design.

10. The method of claim 6, wherein the extracting and the performing employ different computers for at least one of the one or more integrated circuit devices.

11. A system comprising:
one or more processors, the one or more processors programmed to:
receive failure information for one or more integrated circuit devices generated by applying test patterns to the one or more integrated circuit devices;
extract a sub-circuit from a circuit design for the one or more integrated circuit devices based on the failure information, the sub-circuit comprising one or more portions of the circuit design that include one or more defects in the one or more integrated circuit devices, wherein the extracting comprises combining fan-in cones of failing observation points and adding fan-in cones of one or more passing observation points to the combined fan-in cones of the failing observation points, wherein the adding is performed if a size of the sub-circuit is smaller than a predetermined value;
perform fault diagnosis on the sub-circuit to generate diagnosis data based on the test patterns and the failure information; and
output the diagnosis data.

12. The system of claim 11, wherein the one or more passing observation points are selected based on one or more relationships with the failing observation points.

13. The system of claim 11, wherein the extracting is further based on clock information of the test patterns.

14. The system of claim 11, wherein the extracting is further based on layout information of the circuit design.

* * * * *